(12) United States Patent
Fujita et al.

(10) Patent No.: US 12,116,692 B2
(45) Date of Patent: Oct. 15, 2024

(54) QUARTZ GLASS CRUCIBLE

(71) Applicant: SUMCO CORPORATION, Tokyo (JP)

(72) Inventors: Takeshi Fujita, Akita (JP); Ken Kitahara, Akita (JP); Tomokazu Katano, Tokyo (JP); Eriko Kitahara, Akita (JP)

(73) Assignee: SUMCO CORPORATION, Tokyo (JP)

( * ) Notice: Subject to any disclaimer, the term of this patent is extended or adjusted under 35 U.S.C. 154(b) by 713 days.

(21) Appl. No.: 17/413,925

(22) PCT Filed: Dec. 16, 2019

(86) PCT No.: PCT/JP2019/049119
§ 371 (c)(1),
(2) Date: Jun. 14, 2021

(87) PCT Pub. No.: WO2020/137647
PCT Pub. Date: Jul. 2, 2020

(65) Prior Publication Data
US 2022/0090290 A1    Mar. 24, 2022

(30) Foreign Application Priority Data

Dec. 27, 2018 (JP) ................. 2018-244360
Dec. 27, 2018 (JP) ................. 2018-244362

(51) Int. Cl.
*C03B 15/10* (2006.01)
*C03B 19/09* (2006.01)
(Continued)

(52) U.S. Cl.
CPC ............ *C30B 15/10* (2013.01); *C03B 19/095* (2013.01); *C03C 3/06* (2013.01); *C03C 4/10* (2013.01);
(Continued)

(58) Field of Classification Search
None
See application file for complete search history.

(56) References Cited

U.S. PATENT DOCUMENTS

2010/0107970 A1    5/2010    Kodama et al.
2010/0236473 A1    9/2010    Kishi
(Continued)

FOREIGN PATENT DOCUMENTS

CN    106868583 A    6/2017
EP      1024118 A2    8/2000
(Continued)

OTHER PUBLICATIONS

An Office Action issued by the German Patent Office, mailed Jun. 19, 2023, for German counterpart application No. 112019006492.4 (9 pages).

(Continued)

*Primary Examiner* — Jodi C Franklin
(74) *Attorney, Agent, or Firm* — Law Office of Katsuhiro Arai

(57) ABSTRACT

A quartz glass crucible 1 having a cylindrical side wall portion 10a, a bottom portion 10b, and a corner portion 10c connecting the side wall portion 10a and the bottom portion 10b to each other includes a transparent layer 11 made of quartz glass, and a bubble layer 12 made of quartz glass and formed outside the transparent layer 11. A ratio of an infrared transmittance of the corner portion 10c at a maximum thickness position of the corner portion 10c to an infrared transmittance of the side wall portion 10a is 0.3 or more and 0.99 or less, and an absolute value of a rate of change in infrared transmittance in a height direction along a wall surface of the crucible from a center of the bottom portion 10b toward an upper end of the side wall portion 10a is 3%/cm or less.

16 Claims, 7 Drawing Sheets (a)

(b)

(51) Int. Cl.
*C03C 3/06* (2006.01)
*C03C 4/10* (2006.01)
*C30B 15/10* (2006.01)

(52) U.S. Cl.
CPC ...... *C03C 2201/02* (2013.01); *C03C 2204/00* (2013.01)

(56) References Cited

U.S. PATENT DOCUMENTS

| | | | |
|---|---|---|---|
| 2015/0007764 A1* | 1/2015 | Sudo | C30B 15/26 356/601 |
| 2015/0267318 A1* | 9/2015 | Hunermann | C30B 15/10 117/30 |
| 2022/0090291 A1 | 3/2022 | Kitahara et al. | |

FOREIGN PATENT DOCUMENTS

| JP | H0753295 A | 2/1995 |
|---|---|---|
| JP | H08301693 A | 11/1996 |
| JP | H09157082 A | 6/1997 |
| JP | 2000159593 A | 6/2000 |
| JP | 2000219593 A | 8/2000 |
| JP | 2002326889 A | 11/2002 |
| JP | 2004107163 A | 4/2004 |
| JP | 2009084114 A | 4/2009 |
| JP | 2010105880 A | 5/2010 |
| JP | 2016193809 A | 11/2016 |
| JP | 2018039702 A | 3/2018 |
| JP | 2018043903 A | 3/2018 |
| WO | 2020137648 A1 | 7/2020 |

OTHER PUBLICATIONS

Non-Final Office Action issued by U.S. Patent and Trademark Office, dated Aug. 10, 2023, for a co-pending U.S. Appl. No. 17/413,929. (29 pages).

Notice of Allowance issued by U.S. Patent and Trademark Office, dated Jan. 18, 2024, for a co-pending U.S. Appl. No. 17/413,929. (13 pages).

International Search Report (ISR) mailed Feb. 18, 2020, issued for International application No. PCT/JP2019/049119. (2 pages).

International Search Report (ISR) mailed Feb. 18, 2020, issued for International application No. PCT/JP2019/049120 for a co-pending U.S. Appl. No. 17/413,929. (2 pages).

\* cited by examiner

QUARTZ GLASS CRUCIBLE

CROSS-REFERENCE TO RELATED APPLICATIONS

This application is the U.S. National Phase under 35 U.S.C. § 371 of International Application PCT/JP2019/049119, filed Dec. 16, 2019, which claims priority to Japanese Patent Application No. JP2018-244360, filed Dec. 27, 2018 and No. JP2018-244362, filed Dec. 27, 2018. The International Application was published under PCT Article 21(2) in a language other than English.

TECHNICAL FIELD

The present invention relates to a quartz glass crucible and, particularly to a quartz glass crucible used for manufacturing a silicon single crystal by the Czochralski method (CZ method).

BACKGROUND ART

A quartz glass crucible is used for manufacturing a silicon single crystal by the CZ method. In the CZ method, a silicon raw material is heated and melted in the quartz glass crucible, a seed crystal is dipped into the silicon melt, and then the seed crystal is gradually pulled up while rotating the crucible to grow a single crystal. In order to manufacture a high-quality silicon single crystal for a semiconductor device at low costs, it is necessary to increase the single crystallization rate in a single pulling-up step. For this, a crucible capable of stably holding the silicon melt when used for a long period of time is necessary.

Regarding the quartz glass crucible, for example, Patent Literature 1 describes a quartz glass crucible for pulling up a silicon single crystal which is less likely to be deformed during the pulling up of a silicon single crystal, does not adversely affect the convection of silicon, and can achieve a high single crystallization rate. The thickness of this quartz glass crucible is uniform over the entire area, and a transparent layer at a peripheral wall portion is formed thicker than a transparent layer at a corner portion.

In addition, Patent Literature 2 proposes a quartz glass crucible for pulling up a silicon single crystal, which includes a transparent layer having a bubble content of less than 0.3%, a translucent layer having a bubble content of 0.3% to 0.6%, and an opaque layer having a bubble content of more than 0.6% from the inner surface side toward the outer surface side of the crucible in order to suppress local temperature variation of molten silicon and to manufacture a homogeneous silicon single crystal even when pulling up a large silicon single crystal.

In addition, Patent Literature 3 describes a quartz crucible for pulling up a silicon single crystal, which can increase the yield of a single crystal having a high oxygen concentration without impairing the heat retention of the crucible. This quartz crucible is characterized in that the inner surface side of a wall body is formed of a transparent glass layer, the outer surface side of the wall body is formed of an opaque glass layer, the thickness of the transparent glass layer at a corner portion that connects a peripheral wall portion and a bottom portion of the crucible is larger than those of transparent glass layers of other wall body parts by 0.5 mm or more, and the thickness of the opaque glass layer of the corner portion is smaller than those of other parts by 0.5 mm or more.

BACKGROUND ART LITERATURE

Patent Literature

Patent Literature 1: Japanese Patent Application Laid-Open No. 2002-326889
Patent Literature 2: Japanese Patent Application Laid-Open No. 2010-105880
Patent Literature 3: Japanese Patent Application Laid-Open No. Hei-8-301693

SUMMARY OF INVENTION

Problems to be Solved by the Invention

During a step of pulling up a silicon single crystal, the inner surface of a quartz glass crucible comes into contact with a silicon melt and is gradually eroded, so that the silicon single crystal manufactured by the CZ method contains oxygen supplied from the quartz glass crucible. In recent years, a silicon single crystal for highly integrated semiconductor devices is required to have a low oxygen concentration of about $9 \times 10^{17}$ to $12 \times 10^{17}$ atoms/cm$^3$. In addition, it is desirable that the oxygen concentration in the silicon single crystal is as uniform as possible in both the longitudinal direction (pulling-up axis direction) and the radial direction (cross-sectional direction) of the silicon single crystal.

However, in a case where a silicon single crystal having a low oxygen concentration is to be pulled up using a quartz glass crucible in the related art, it is difficult to uniformize an oxygen concentration distribution in the longitudinal direction (pulling-up axis direction) of the silicon single crystal. In particular, as shown in FIG. 10, a specific part (here, a sharp drop (a decrease of 10% or more) in the oxygen concentration at a position where the crystal length (relative value) is 0.44) in the longitudinal direction of the silicon single crystal becomes a major problem. The oxygen concentration distribution in the longitudinal direction of the silicon single crystal can be adjusted by adjusting the crystal pulling-up conditions during the crystal pulling-up step, but the adjustment range is also limited. Accordingly, an improvement is desired.

Therefore, an object of the present invention is to provide a quartz glass crucible capable of pulling up a silicon single crystal having a low oxygen concentration and a stable oxygen concentration distribution in a longitudinal direction.

Means for Solving the Problems

In order to solve the above problems, a quartz glass crucible according to the present invention is a quartz glass crucible including: a cylindrical side wall portion; a bottom portion; a corner portion connecting the side wall portion and the bottom portion to each other; a transparent layer made of quartz glass that does not contain bubbles; and a bubble layer formed outside the transparent layer and made of quartz glass containing a large number of bubbles, in which a ratio of an infrared transmissivity of the corner portion at a maximum thickness position of the corner portion to an infrared transmissivity of the side wall portion is 0.3 or more and 0.99 or less, and an absolute value of a rate of change in infrared transmissivity in a height direction along a wall surface of the crucible from a center of the bottom portion toward an upper end of the side wall portion is 3%/cm or less.

According to the present invention, by lowering the infrared transmissivity of the corner portion of the crucible, erosion of the crucible due to a temperature rise in the inner surface of the corner portion can be suppressed, and accordingly, the amount of oxygen supplied from the crucible to the silicon melt can be suppressed, whereby a reduction in the amount of oxygen of a silicon single crystal can be achieved. In addition, by setting the change in the infrared transmissivity from the bottom portion to the side wall portion of the crucible to be gentle, it is possible to suppress the variation in the inner surface temperature distribution of the quartz glass crucible, and it is possible to suppress a sudden change in the oxygen concentration distribution in a longitudinal direction (crystal growth direction) of the silicon single crystal at a specific part. Therefore, it is possible to pull up a silicon single crystal having a low oxygen concentration and a stable oxygen concentration distribution in a pulling-up axis direction.

In the present invention, it is preferable that the infrared transmissivity of the corner portion at the maximum thickness position is 25% or more and 51% or less. Accordingly, it is possible to lower the infrared transmissivity of the corner portion compared to that in the related art, and to suppress an excessive temperature rise in the inner surface of the corner portion. Therefore, the amount of oxygen supplied from the crucible to the silicon melt can be suppressed, so that a silicon single crystal having a low oxygen concentration can be manufactured.

In the present invention, it is preferable that an absolute value of a rate of change in thickness of the bubble layer in the height direction along the wall surface of the crucible from the center of the bottom portion toward the upper end of the side wall portion is 2.5 mm/cm or less. Accordingly, the absolute value of the rate of change in infrared transmissivity in the height direction along the wall surface of the crucible can be set to 3%/cm or less. Therefore, it is possible to manufacture a silicon single crystal having a low oxygen concentration and a stable oxygen concentration distribution in the pulling-up axis direction.

In addition, a quartz glass crucible according to the present invention is a quartz glass crucible including: a cylindrical side wall portion; a bottom portion; a corner portion connecting the side wall portion and the bottom portion to each other; a transparent layer made of quartz glass that does not contain bubbles; and a bubble layer made of quartz glass containing a large number of bubbles and formed outside the transparent layer, in which a ratio of an infrared transmissivity of the corner portion at a maximum thickness position of the corner portion to an infrared transmissivity of the side wall portion is 0.3 or more and 0.99 or less, and an absolute value of a rate of change in thickness of the bubble layer in a height direction along a wall surface of the crucible from a center of the bottom portion toward an upper end of the side wall portion is 2.5 mm/cm or less.

According to the present invention, by lowering the infrared transmissivity of the corner portion of the crucible, erosion of the crucible due to a temperature rise in the inner surface of the corner portion can be suppressed, and accordingly, the amount of oxygen supplied from the crucible to the silicon melt can be suppressed, whereby a reduction in the amount of oxygen of a silicon single crystal can be achieved. In addition, by setting the change in the thickness of the bubble layer from the bottom portion to the side wall portion of the crucible to be gradual, it is possible to set the change in the infrared transmissivity to be gradual, and suppress the variation in the inner surface temperature distribution of the quartz glass crucible. Therefore, it is possible to suppress a sudden change in the oxygen concentration distribution in the longitudinal direction (crystal growth direction) of the silicon single crystal at a specific part, so that it is possible to pull up a silicon single crystal having a low oxygen concentration and a stable oxygen concentration distribution in the pulling-up axis direction.

In the present invention, it is preferable that an aperture of the crucible is 32 inches, a maximum thickness of the corner portion is 19 mm or more and 30 mm or less, and a thickness of the bubble layer at the maximum thickness position of the corner portion is 18 mm or more and 29 mm or less. It should be noted the thickness of each part of the crucible and the thickness of the bubble layer are values obtained by measuring a crucible before use in a room temperature environment. Accordingly, the infrared transmissivity of the corner portion at the maximum thickness position can be set to 25% to 51%, whereby a silicon single crystal having a low oxygen concentration can be manufactured.

In the present invention, it is preferable that a bubble content of the bubble layer at the maximum thickness position of the corner portion is more than 0.1 vol % and 5 vol % or less. It should be noted that the bubble content is a value obtained by measuring a crucible before use in a room temperature environment. Accordingly, the infrared transmissivity of the corner portion at the maximum thickness position can be set to 25% or more and 51% or less, whereby a silicon single crystal having a low oxygen concentration can be manufactured.

It is preferable that the quartz glass crucible according to the present invention further includes a semi-molten layer formed outside the bubble layer and made of raw material silica powder solidified in an incompletely melted state, in which the infrared transmissivity is a value measured in a state where the semi-molten layer is removed. Accordingly, the infrared transmissivity of the crucible can be defined in a state as close as possible to an actual pulling-up step.

Effects of the Invention

According to the present invention, it is possible to provide a quartz glass crucible capable of pulling up a silicon single crystal having a low oxygen concentration and a stable oxygen concentration distribution in a pulling-up axis direction.

MODE FOR CARRYING OUT THE INVENTION

Hereinafter, preferred embodiments of the present invention will be described in detail with reference to the accompanying drawings.

Figure 1:
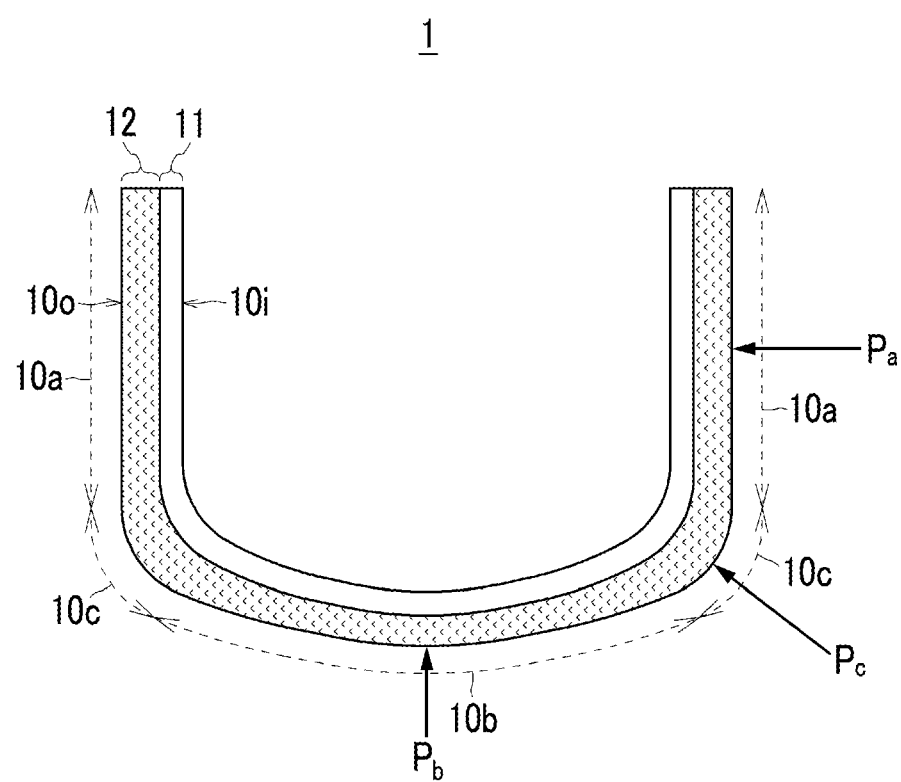
FIG. 1 is a schematic side cross-sectional view illustrating the structure of a quartz glass crucible according to an embodiment of the present invention.

FIG. 1 is a schematic side cross-sectional view illustrating the structure of a quartz glass crucible according to an embodiment of the present invention.

As illustrated in FIG. 1, a quartz glass crucible 1 is a container made of silica glass for supporting a silicon melt, and has a cylindrical side wall portion 10a, a bottom portion 10b, and a corner portion 10c that connects the side wall portion 10a and the bottom portion 10b to each other. The bottom portion 10b is preferably a so-called round bottom that is gently curved, but may also be a so-called flat bottom. The corner portion 10c is located between the side wall portion 10a and the bottom portion 10b, and is a part having a greater curvature than the bottom portion 10b.

The aperture of the quartz glass crucible 1 is preferably 22 inches (about 560 mm) or more, and particularly preferably 32 inches (about 800 mm) or more. This is because such a crucible having a large aperture is used for pulling up a large-size silicon single crystal ingot having a diameter of 300 mm or more, and is required not to affect the quality of the single crystal even when used for a long period of time. In recent years, crystal quality in a pulling-up axis direction has become a problem due to an increase in the size of crucibles and the lengthening of a pulling-up step caused by an increase in the size of silicon single crystals, and stabilization of crystal quality is an extremely important issue for large crucibles. Although the thickness of the crucible slightly varies depending on which part it is, the thickness of the side wall portion 10a of a crucible of 22 inches or more is preferably 7 mm or more, and the thickness of the side wall portion 10a of a crucible of 24 inches (about 600 mm) or more is preferably 8 mm or more. In addition, the thickness of the side wall portion 10a of a large crucible of 32 inches or more is preferably 10 mm or more, and the thickness of the side wall portion 10a of a large crucible of 40 inches (about 1000 mm) or more is more preferably 13 mm or more.

The quartz glass crucible 1 has a two-layer structure, and includes a transparent layer 11 made of quartz glass containing no bubbles, and a bubble layer 12 (opaque layer) which is made of quartz glass containing a large number of minute bubbles and is provided on the outer side of the crucible from the transparent layer 11.

The transparent layer 11 is a layer that forms an inner surface 10i of the crucible that is in contact with a silicon melt, and is provided to prevent a decrease in single crystallization rate due to bubbles in quartz glass. The thickness of the transparent layer 11 is preferably 0.5 to 12 mm, and is set to an appropriate thickness for each part of the crucible so as not to cause the bubble layer 12 to be exposed due to the transparent layer 11 completely disappearing by erosion during a single crystal pulling-up step. Similar to the bubble layer 12, the transparent layer 11 is preferably provided over the entire crucible from the side wall portion 10a to the bottom portion 10b of the crucible. However, in an upper end portion (rim portion) of the crucible that is not in contact with the silicon melt, the formation of the transparent layer 11 can be omitted.

The transparent layer 11 is a part on the inner side of the quartz crucible having a bubble content of 0.1 vol % or less. The expression "the transparent layer 11 contains no bubbles" means that the bubble content and the bubble size are such that the single crystallization rate does not decrease due to the bubbles. This is because there is concern that when bubbles are present in the vicinity of the inner surface of the crucible, the bubbles in the vicinity of the inner surface of the crucible cannot be confined to the quartz glass due to the erosion of the inner surface of the crucible; bubbles in the quartz glass may burst due to thermal expansion during crystal pulling-up, and crucible fragments (quartz pieces) may delaminate. In a case where crucible fragments released into the melt are carried to the growth interface of the single crystal by convection of the melt and are incorporated into the single crystal, this causes dislocation of the single crystal. In addition, in a case where bubbles released into the melt due to erosion of the inner surface of the crucible float up to a solid/liquid interface and are incorporated into the single crystal, this causes pinholes. The average diameter of bubbles in the transparent layer 11 is preferably 100 μm or less.

The bubble content of the transparent layer 11 and the diameter of the bubbles can be measured nondestructively using optical detecting means by the method disclosed in Japanese Patent Application Laid-Open No. 2012-116713. The optical detecting means includes a light-receiving device which receives transmitted light or reflected light of the light irradiating the crucible. Irradiation light-emitting means may be built in the light-receiving device, or external light-emitting means may also be used. In addition, as the optical detecting means, one that can be turned along the inner surface of the crucible is preferably used. As the irradiation light-emitting means, X-rays, laser light, and the like, as well as visible light, ultraviolet light, and infrared light can be used. As the light-receiving device, a digital camera including an optical lens and an imaging element can be used. Measurement results obtained by the optical detecting means are received by an image processing device to calculate the bubble content per unit volume.

In order to detect bubbles present at a certain depth from the surface of the crucible, the focal point of the optical lens may be scanned from the surface in the depth direction. Specifically, an image of the inner surface of the crucible is taken using the digital camera, the inner surface of the crucible is divided into predetermined areas to obtain a reference area S1, an area S2 occupied by bubbles is obtained for each reference area S1, and an area bubble content $Ps=(S2/S1)\times100(\%)$ is calculated.

In the calculation of the bubble content by the volume ratio, a reference volume V1 is obtained from the depth at which the image is taken and the reference area S1. Furthermore, a bubble is regarded as a spherical shape, and a volume V2 of the bubble is calculated from the diameter of the bubble. A volume bubble content $Pv=(V2/V1)\times100(\%)$ is calculated from V1 and V2. In the present invention, the volume bubble content Pv is defined as "bubble content". An arithmetic average value obtained from the diameters of the bubbles calculated by regarding the bubble as a sphere is defined as the "average diameter of the bubbles".

It should be noted that the reference volume is 5 mm×5 mm×depth 0.45 mm, the minimum bubble diameter to be measured is 5 μm (those having a diameter of less than 5 μm are ignored), and a resolution may be set such that bubbles having a diameter of 5 μm can be measured. The focal length of the optical lens is shifted in the depth direction of the reference volume V1, the bubbles contained inside the reference volume are captured, and the diameter of the bubbles is measured.

The bubble layer 12 is a layer forming an outer surface 10$o$ of the crucible, and is provided to enhance the heat retention of the silicon melt in the crucible, and to heat the silicon melt in the crucible as uniformly as possible by dispersing radiant heat from a heater provided to surround the crucible in a single crystal pulling-up apparatus. Therefore, the bubble layer 12 is provided over the entire crucible from the side wall portion 10$a$ to the bottom portion 10$b$ of the crucible. The thickness of the bubble layer 12 is a value obtained by subtracting the thickness of the transparent layer 11 from the thickness of the crucible, and varies depending on the part of the crucible. The bubble content of the bubble layer 12 can be obtained, for example, by specific gravity measurement (Archimedes' method) of an opaque quartz glass piece cut out from the crucible.

The bubble content of the bubble layer 12 is higher than that of the transparent layer 11, preferably more than 0.1 vol % and 5 vol % or less, and more preferably 1 vol % or more and 4 vol % or less. This is because when the bubble content of the bubble layer 12 is 0.1 vol % or less, the function of the bubble layer 12 cannot be manifested, and heat retention becomes insufficient. Furthermore, in a case where the bubble content of the bubble layer 12 exceeds 5 vol %, there is concern that the crucible may be greatly deformed due to expansion of the bubbles and the single crystal yield may decrease, which causes further insufficient heat transfer properties. In particular, when the bubble content of the bubble layer 12 is 1 to 4%, the balance between heat retention and heat transfer properties is good and preferable. A large number of bubbles contained in the bubble layer 12 can be visually recognized.

In order to prevent contamination of the silicon melt, it is desirable that the quartz glass forming the transparent layer 11 has high purity. Therefore, the quartz glass crucible 1 according to the present embodiment preferably includes two layers, an inner surface layer formed from synthetic silica powder (hereinafter, referred to as "synthetic layer") and an outer surface layer formed from natural silica powder (hereinafter, referred to as "natural layer"). The synthetic silica powder can be manufactured by vapor phase oxidation of silicon tetrachloride ($SiCl_4$) (dry synthesis method) or hydrolysis of silicon alkoxide (sol-gel method). The natural silica powder is silica powder manufactured by pulverizing into particles a natural mineral containing α-quartz as a primary component.

As will be described in detail later, the two-layer structure of the synthetic layer and the natural layer can be manufactured by depositing the natural silica powder along the inner surface of a mold for manufacturing a crucible, depositing the synthetic silica powder thereon, and melting the silica powder by Joule heat through arc discharge. In an initial stage of the arc melting step, the transparent layer 11 is formed by removing bubbles through strong evacuation from the outside of the deposition layers of the silica powder. Thereafter, the evacuation is stopped or weakened, whereby the bubble layer 12 is formed outside the transparent layer 11. For this reason, although the boundary surface between the synthetic layer and the natural layer does not always coincide with the boundary surface between the transparent layer 11 and the bubble layer 12, like the transparent layer 11, the synthetic layer preferably has a thickness that does not completely disappear by erosion of the inner surface of the crucible during the crystal pulling-up step.

In the quartz glass crucible 1 according to the present embodiment, the infrared transmissivity of the corner portion 10$c$ is lowered to keep the inner surface temperature of the corner portion 10$c$ low, thereby lowering the oxygen concentration in the silicon single crystal. In addition, the allowable ranges of the rate of change in infrared transmissivity from a center Pb of the bottom portion 10$b$ toward the upper end of the side wall portion 10$a$ and the rate of change in thickness of the bubble layer 12 are defined so that the inner surface temperature distribution of the crucible does not change significantly and thus a change in convection of the silicon melt is suppressed, whereby a sudden change in the oxygen concentration in the silicon single crystal can be prevented.

In the present embodiment, the infrared transmissivity of a maximum thickness position Pc of the corner portion 10$c$ of the crucible is preferably 25 to 51%. This is because in a case where the infrared transmissivity is higher than 51%, the amount of the crucible eroded increases due to a temperature rise in the inner surface of the corner portion 10$c$, which increases the oxygen concentration in the silicon melt, and a reduction in the amount of oxygen of the single crystal cannot be achieved, whereas in a case where the infrared transmissivity is lower than 25%, the amount of heat input to the crucible is too low, and the growth of a single crystal from the silicon melt becomes unstable. The infrared transmissivity of the crucible is, in a case where infrared light is incident from an infrared light source disposed on one surface (outer surface 10$o$) side of the crucible wall and infrared light emitted from the opposite surface (inner surface 10$i$) side is received by a laser power meter, the ratio of the amount of emitted infrared light to the amount of incident infrared light.

In order to set the infrared transmissivity of the corner portion 10$c$ to 25 to 51%, the maximum thickness of the corner portion 10$c$ is preferably 19 to 30 mm, and the thickness of the bubble layer 12 at the corner portion 10$c$ is preferably 18 to 29 mm. In addition, the bubble content of the bubble layer 12 at the corner portion 10$c$ is preferably 0.1 to 5 vol %. It should be noted the thickness and bubble content of the crucible are values obtained by measuring an unused crucible in a room temperature environment.

The ratio of the infrared transmissivity $T_R$ (%) of the corner portion 10$c$ at the maximum thickness position of the corner portion 10$c$ to the infrared transmissivity $T_W$ (%) of the side wall portion 10$a$ of the crucible is preferably 0.3 or more and 0.99 or less ($0.33 \leq T_R/T_W \leq 0.9$). By lowering the infrared transmissivity of the corner portion 10$c$ of the crucible compared to that of the side wall portion 10$a$, erosion of the crucible due to a temperature rise in the inner surface of the corner portion 10$c$ can be suppressed, and accordingly, the amount of oxygen supplied from the crucible to the silicon melt can be suppressed, whereby a reduction in the amount of oxygen of the silicon single crystal can be achieved.

Figure 2:
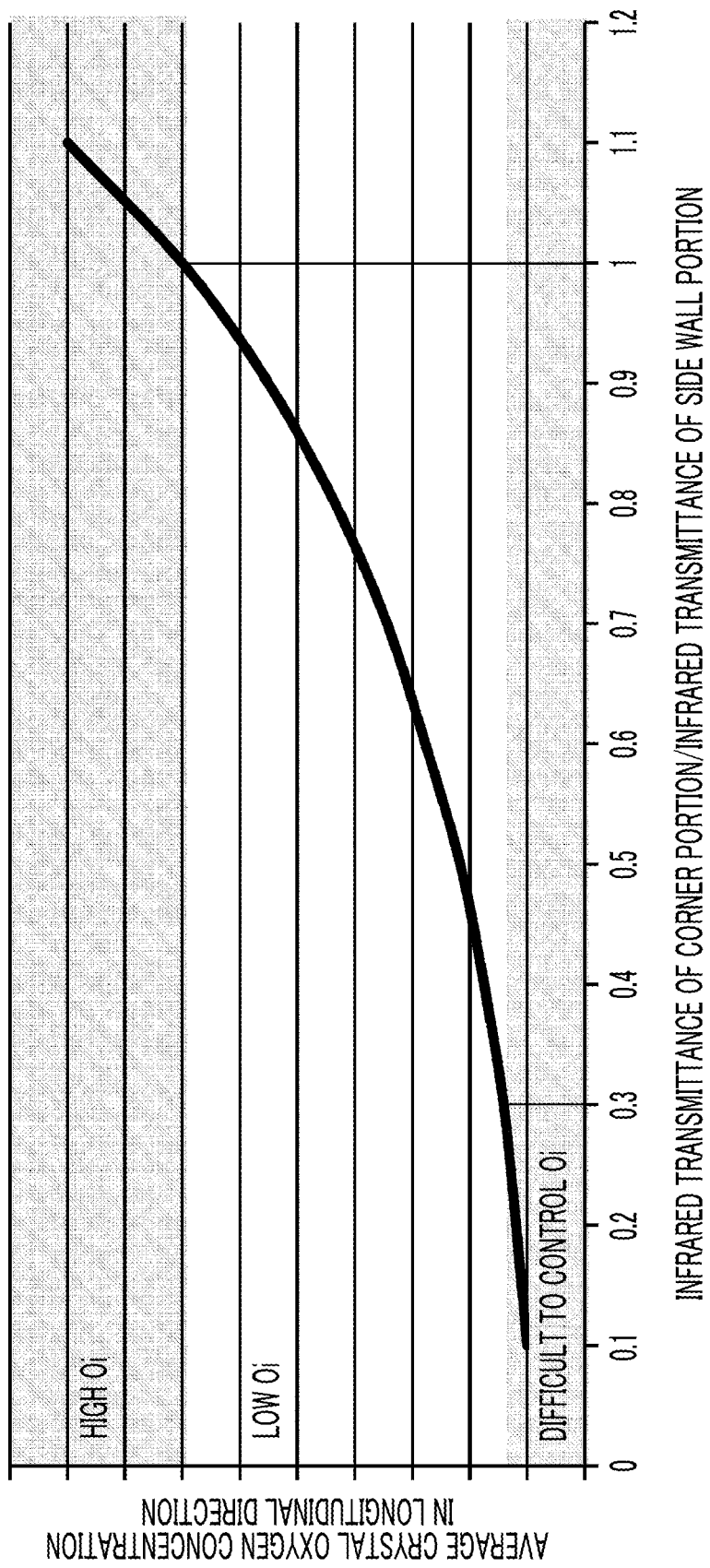
FIG. 2 is a graph showing the relationship between an infrared transmissivity ratio and an average crystal oxygen concentration.

FIG. 2 is a graph showing the relationship between the infrared transmissivity ratio and the average crystal oxygen concentration. As shown in the graph, in a case where the ratio of the infrared transmissivity of the corner portion at the maximum thickness position to the infrared transmissivity of the side wall portion is less than 0.3, the convection of the silicon melt tends to be unstable, and it is difficult to control the oxygen concentration of the crystal. On the other hand, in a case where the ratio exceeds 0.99, the crystal oxygen concentration increases. However, when the ratio of the infrared transmissivity is 0.3 or more and 0.99 or less, a reduction in the amount of oxygen of the silicon single crystal can be achieved.

As described above, by suppressing the infrared transmissivity of the corner portion 10c of the crucible to be lower than in the related art, the amount of oxygen supplied into the silicon melt can be suppressed to a low level, and a reduction in the amount of oxygen of the silicon single crystal can be achieved. However, in a case where the infrared transmissivity of the corner portion 10c is extremely lower than that of the side wall portion 10a and the bottom portion 10b, there is concern that a sharp drop in the oxygen concentration may occur at a specific part in a pulling-up axis direction of the silicon single crystal. Therefore, in the present embodiment, the above problem is solved by setting changes in the infrared transmissivity and the thickness of the crucible wall from the bottom portion 10b of the crucible to the side wall portion 10a to be gentle.

Figure 3:
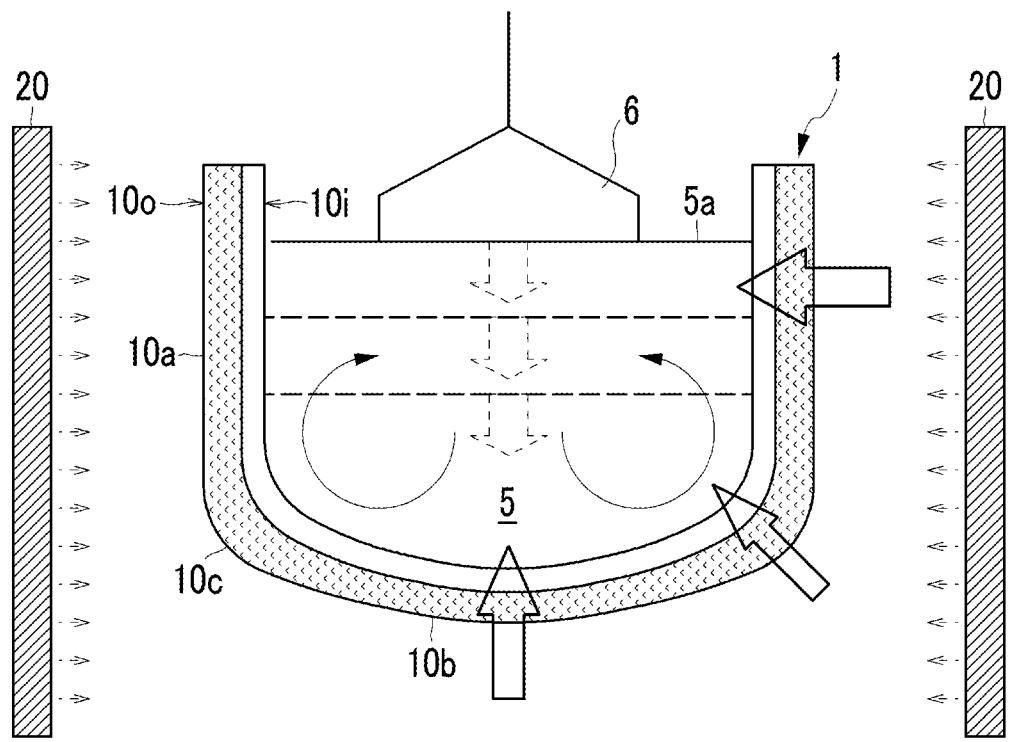
FIG. 3 is a schematic view illustrating the quartz glass crucible and a state of a silicon melt during a crystal pulling-up step.

FIG. 3 is a schematic view illustrating the quartz glass crucible and the state of the silicon melt during a crystal pulling-up step.

As shown in FIG. 3, a heater 20 is disposed outside the quartz glass crucible 1 in a crystal pulling-up furnace, and the heat from the heater 20 toward the inside of the crucible (see the solid line arrows) is strongly affected by the infrared transmissivity and the thermal conductivity of the crucible, and reaches the inner surface 10i of the crucible. By heating, not only is the molten state of the silicon raw material in the crucible maintained, but also the inner surface 10i of the crucible is dissolved into the silicon melt. In particular, the inner surface 10i of the corner portion 10c of the quartz glass crucible 1 is a part that tends to have a higher temperature than the inner surfaces 10i of the side wall portion 10a and the bottom portion 10b, and easily dissolves in the silicon melt. Therefore, by lowering the infrared transmissivity at the corner portion 10c, the temperature of the inner surface 10i of the corner portion 10c is lowered, and the dissolution of the corner portion 10c is suppressed. As a result, the supply of oxygen from the corner portion 10c of the crucible to the silicon melt is suppressed, so that the oxygen concentration of the silicon single crystal 6 can be reduced.

In addition, in the present embodiment, while lowering the infrared transmissivity at the corner portion 10c of the quartz glass crucible 1, the rate of change in infrared transmissivity and the rate of change in thickness of the bubble layer 12 in the height direction along the wall surface of the crucible are set to be gentle, whereby even if the silicon melt 5 in the crucible is consumed and the position of a melt surface 5a is lowered as the pulling-up of the silicon single crystal progresses, the effect of a change in the amount of the melt is reduced, thereby suppressing a sudden change in the natural convection of the silicon melt 5. By this suppression, it is possible to prevent the oxygen concentration from dropping sharply in a straight body portion of the silicon single crystal 6.

Specifically, the absolute value |ΔW| of the rate of change in infrared transmissivity is preferably 3%/cm or less, and the absolute value |ΔT| of the rate of change in thickness of the bubble layer 12 is preferably 2.5 mm/cm or less. As described above, by gradually changing the infrared transmissivity and the thickness of the bubble layer 12 from the bottom portion 10b to the side wall portion 10a of the crucible, it is possible to prevent a sudden change in the state (mode) of convection of the melt during the crystal pulling-up step, thereby suppressing a sudden drop in the oxygen concentration at a specific part in the pulling-up axis direction of the silicon single crystal.

The rate of change ΔW of the infrared transmissivity is a value representing the difference in infrared transmissivity between any two points separated by a specific distance (1 cm or more) on a measurement line from the center Pb of the bottom portion 10b to the upper end of the side wall portion 10a. Therefore, for example, when the infrared transmissivity of the side wall portion 10a at a measurement position $P_1$ is $W_1$ (%) and the infrared transmissivity at another measurement position $P_2$ separated by a predetermined distance L (cm) along the outer surface 10o of the crucible is $W_2$ (%), a value obtained by dividing the difference $(W_1-W_2)$ in infrared transmissivity between the two points by the distance L is the rate of change in infrared transmissivity: $\Delta W=(W_1-W_2)/L$.

Similarly, the rate of change ΔT in thickness of the bubble layer 12 is a value representing the difference in thickness of the bubble layer 12 between any two points separated by a specific distance (1 cm or more) on the measurement line from the center Pb of the bottom portion 10b to the upper end of the side wall portion 10a. Therefore, for example, when the thickness of the bubble layer 12 at the measurement position $P_1$ of the side wall portion 10a is $T_1$ (mm) and the thickness of the bubble layer 12 at another measurement position $P_2$ separated from $P_1$ by a predetermined distance L along the outer surface 10o of the crucible is $T_2$ (mm), a value obtained by dividing the difference $(T_1-T_2)$ in thickness of the bubble layer 12 between the two points by the distance L is the rate of change in thickness of the bubble layer 12: $\Delta T=(T_1-T_2)/L$.

The thicknesses of the side wall portion 10a and the bottom portion 10b are preferably smaller than the thickness of the corner portion 10c, and particularly preferably smaller than the thickness of the corner portion 10c by 5 mm or more. It should be noted the thickness of the corner portion 10c indicates the thickness of the corner portion 10c at the maximum thickness position Pc. When the thickness of the corner portion 10c is reduced so that the infrared transmissivity of the corner portion 10c becomes equal to that of the side wall portion 10a or the bottom portion 10b, the thickness of the bubble layer 12 at the corner portion 10c is also reduced, and the inner surface temperature of the corner portion 10c rises during use of the crucible, resulting in an increase in the amount of the inner surface of the crucible eroded and an increase in the oxygen concentration in the silicon single crystal. It is not preferable that the thicknesses of the side wall portion 10a and the bottom portion 10b are as large as that of the corner portion 10c. This is because not only are insufficient heating of the silicon melt and an increase in the melting time incurred, but also a large amount of raw material is used during manufacturing of the crucible, which is not practical.

The thickness of the side wall portion 10a compared to the corner portion 10c is preferably the thickness at an intermediate position Pa (see FIG. 1) of the side wall portion 10a in the height direction. This is because the thickness of the upper end portion of the side wall portion 10a tends to be slightly smaller than the average thickness, the thickness of the lower end portion tends to be slightly larger than the average thickness, and the intermediate position Pa of the side wall portion 10a in the height direction is a position where a value close to the average thickness of the side wall portion 10a can be obtained. Since a change in infrared transmissivity due to the difference in the thickness of the side wall portion 10a is slight, the relationship between the infrared transmissivity of the corner portion 10c at the maximum thickness position Pc and the infrared transmissivity of the side wall portion 10a is established at any position of the side wall portion 10a.

In addition, the thickness of the bottom portion 10b compared to the corner portion 10c is preferably the thickness of the center Pb of the bottom portion 10b. This is because the thickness of the bottom portion 10b tends to be the minimum at the center position of the bottom portion 10b, which is a part where the features of the bottom portion 10b are most apparent.

The infrared transmissivity of each part of the crucible can be adjusted by changing the thickness of the bubble layer 12. The thickness of the bubble layer 12 is a value obtained by subtracting the thickness of the transparent layer 11 from the thickness of the crucible. When the thickness of the transparent layer 11 is constant, as the thickness of the crucible increases, the thickness of the bubble layer 12 also increases. Therefore, for example, by increasing the thickness of the corner portion 10c to increase the thickness of the bubble layer 12, the infrared transmissivity of the corner portion 10c can be lowered.

The infrared transmissivity of each part of the crucible may be adjusted by changing the bubble content of the bubble layer 12. For example, the infrared transmissivity of the corner portion 10c can be lowered by further increasing the bubble content of the bubble layer 12 of the corner portion 10c while keeping the thickness of the bubble layer 12 constant. The bubble content of the bubble layer 12 can be controlled by adjusting the particle size of the raw material silica powder and the temperature at the time of arc heating when the quartz glass crucible 1 is manufactured by the so-called rotational molding method.

Figure 4:
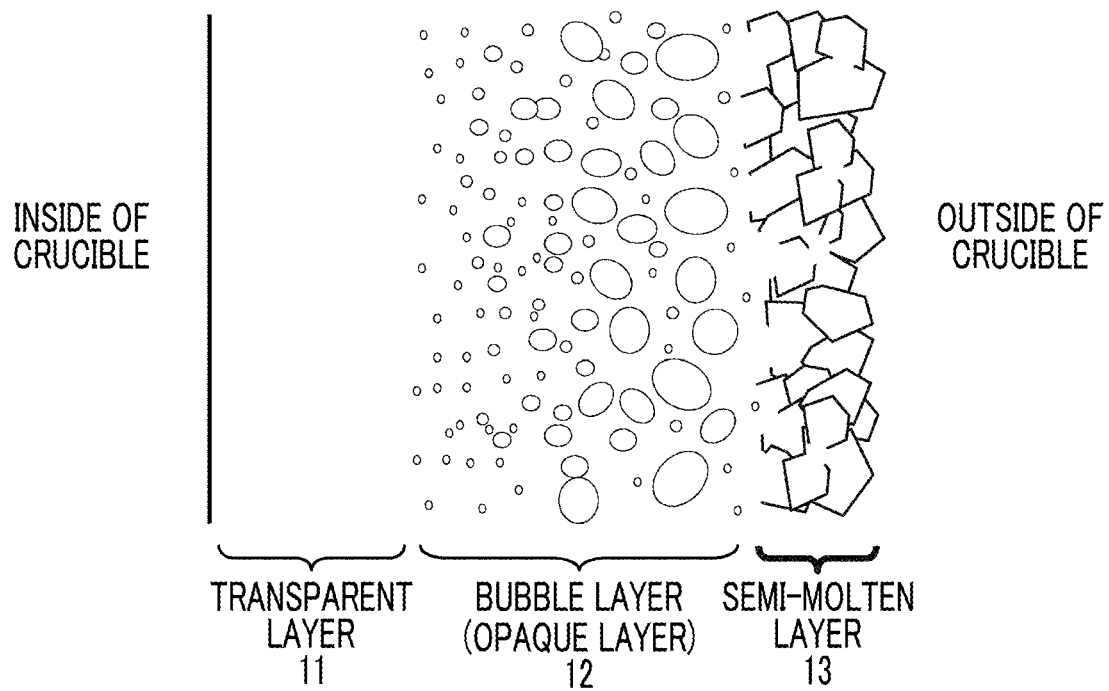
FIG. 4 is a cross-sectional view of a quartz glass crucible in which a semi-molten layer is formed on the outer surface.

As illustrated in FIG. 4, in a case where a semi-molten layer 13 is formed on the outer surface (surface of the bubble layer 12) of the quartz glass crucible 1, the infrared transmissivity of each part of the crucible is preferably measured in a state where the semi-molten layer 13 is removed by polishing or the like. The semi-molten layer 13 is a layer solidified by cooling the raw material silica powder in a partially incompletely melted state (semi-molten state), is in a rugged surface state, and thus greatly scatters and reflects light incident from the surface. The infrared transmissivity of unused crucibles decreases under the effect of the semi-molten layer 13, and individual differences between crucibles also increase. On the other hand, irregularities on the outer surface are smoothed at a high temperature during a crystal pulling-up step, and the effect of scattering and reflection decreases, so that the infrared transmissivity is increased and the individual differences between the crucibles are canceled out. Therefore, by evaluating the infrared transmissivity in a state where the semi-molten layer 13 is removed, it is possible to evaluate the infrared transmissivity of the crucible in a state close to an actual use state.

Figure 5:
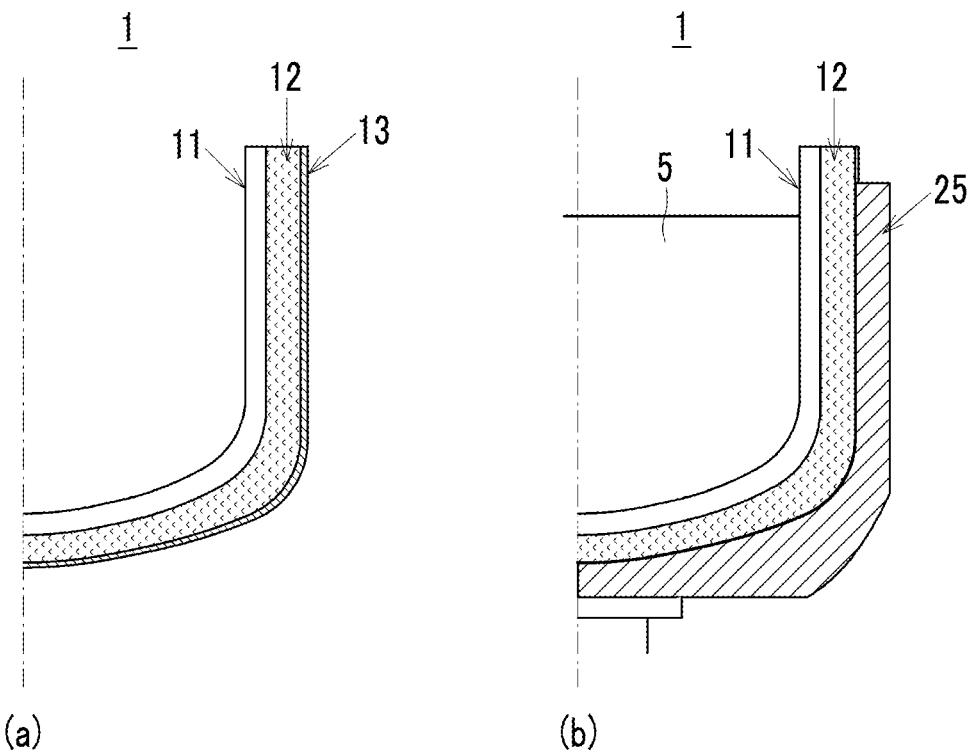
FIGS. 5 (a) and (b) are diagrams for describing a change in the state of a semi-molten layer of the quartz glass crucible, in which FIG. 5 (a) illustrates a state before use, and FIG. 5 (b) illustrates a state during use, respectively.

FIGS. 5 (a) and (b) are diagrams for describing a change in the state of the semi-molten layer 13 of the quartz glass crucible 1, in which FIG. 5 (a) illustrates a state before use, and FIG. 5 (b) illustrates a state during use, respectively.

As illustrated in FIG. 5 (a), there are cases where the semi-molten layer 13 is formed in the quartz glass crucible 1 in a product state before use. As described above, the semi-molten layer 13 is a layer solidified in a state where the raw material silica powder is partially incompletely melted, and the surface state thereof slightly varies for each crucible product due to the difference in the particle size distribution and the melting conditions of the raw material silica powder, and the infrared transmissivity also varies individually. Furthermore, differences in the surface state of the crucible also occur in each part of the crucible such as the side wall portion 10a, the corner portion 10c, and the bottom portion 10b. When such a crucible is installed in a carbon susceptor and actually used at a high temperature, the state of the semi-molten layer 13 changes.

That is, as illustrated in FIG. 5 (b), the quartz glass crucible 1 is softened by a high temperature of 1500° C. or higher during the single crystal pulling-up step, and a liquid pressure that pushes the crucible wall outward is generated by the silicon melt 5 stored in the crucible. On the other hand, since a carbon susceptor 25 is provided outside the quartz glass crucible 1 and the outer surface of the crucible is constrained in the radial direction, the irregularities of the semi-molten layer 13 are crushed and smoothed. Therefore, the infrared transmissivity of the quartz glass crucible during the single crystal pulling-up step is different from that in a pre-used product state.

Usually, the measurement data of an unused crucible is used to evaluate the quality of the quartz glass crucible. However, as described above, since the irregularities of the outer surface of the crucible are canceled out during use, it is not desirable that the crucible is evaluated based on infrared transmissivity measured in a state where the irregularities of the outer surface differ for each crucible and each part. For example, in a case where the semi-molten layer 13 is present, even if the infrared transmissivity of the crucible is very low, in a case where the infrared transmissivity is high when the semi-molten layer causes to exists in an actual pulling-up step, a heat input from the outside of the crucible cannot be suppressed, and the oxygen concentration in the single crystal cannot be lowered.

For the above reasons, in the present invention, the semi-molten layer 13 on the outer surface is intentionally removed to reduce the effect of the irregularities of the outer surface on infrared transmissivity, and then the infrared transmissivity of each part of the crucible is measured and evaluated. That is, the present invention simulates the state during use, particularly the state of the semi-molten layer 13 during use of the crucible with respect to the quartz glass crucible before use, and the infrared transmissivity of the quartz glass crucible in such a state is measured. It should be noted that the infrared transmissivity of the quartz glass crucible during the crystal pulling-up step is affected by bubbles that have been thermally expanded at a high temperature, but even the bubbles before the thermal expansion are effective as an evaluation index of infrared transmissivity.

Figure 6:
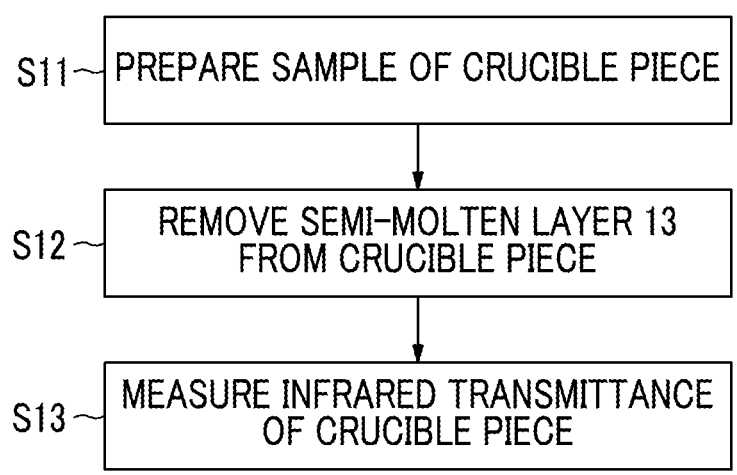
FIG. 6 is a flowchart showing an infrared transmissivity measurement method of a quartz glass crucible using a piece of the crucible.

FIG. 6 is a flowchart showing an infrared transmissivity measurement method of a quartz glass crucible using a piece of a crucible. In addition, FIG. 7 is a schematic view showing the infrared transmissivity measurement method of a quartz glass crucible.

Figure 7:
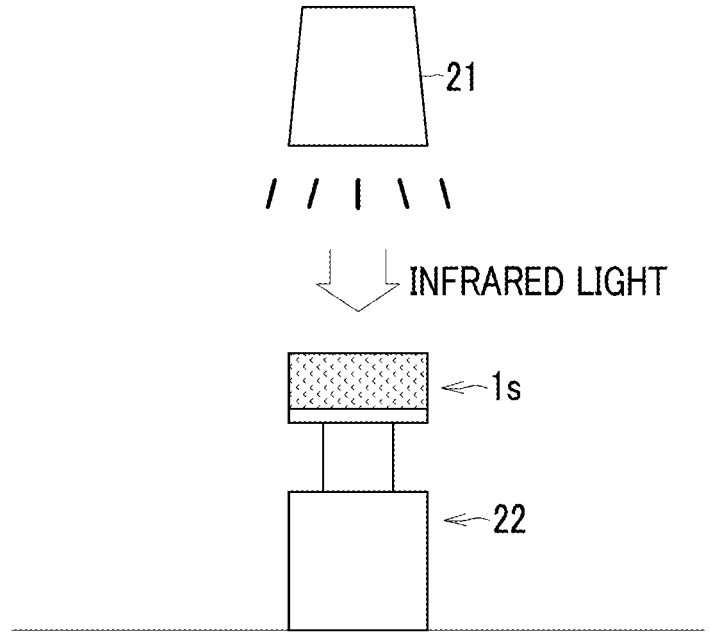
FIG. 7 is a schematic view showing the infrared transmissivity measurement method of a quartz glass crucible.

As shown in FIG. 6 and FIG. 7, in the measurement of the infrared transmissivity of the quartz glass crucible, first, a sample piece of the crucible cut out from the quartz glass crucible is prepared (step S11). As described above, the quartz glass crucible 1 which is the measurement target has the transparent layer 11, the bubble layer 12 formed outside the transparent layer 11, and the semi-molten layer 13 formed outside the bubble layer 12.

Next, the semi-molten layer 13 is removed from the piece of the crucible (step S12). As a method of removing the semi-molten layer 13, there are a polishing treatment and a blasting treatment, but other methods may also be used. The semi-molten layer 13 is preferably completely removed, but may not be completely removed. It is sufficient that the piece of the crucible is processed so that the surface roughness of the outer surface of the crucible on which the semi-molten layer 13 is formed becomes low to some extent. In this case, the arithmetic average roughness Ra of the outer surface of the crucible is preferably 15 μm or less. As described above, by processing the piece of the crucible so that the surface roughness of the outer surface of the piece of the crucible becomes low, it is possible to appropriately evaluate the infrared transmissivity.

Next, infrared transmissivity of the piece of the crucible is measured (step S13). As shown in FIG. 7, in the measurement of the infrared transmissivity of a piece of the crucible 1s, a laser power meter 22 (light-receiving device) is disposed below an infrared lamp 21, and the piece of the crucible 1s is disposed on the light-receiving portion of the laser power meter 22. The infrared light from the infrared lamp 21 passes through the piece of the crucible 1s and is received by the laser power meter 22. The infrared transmissivity of the piece of the crucible 1s is obtained as the ratio of the amount of emitted light to the amount of incident light in a case where infrared light is incident from one surface of the crucible wall and the light emitted from the opposite surface is received.

Figure 8:
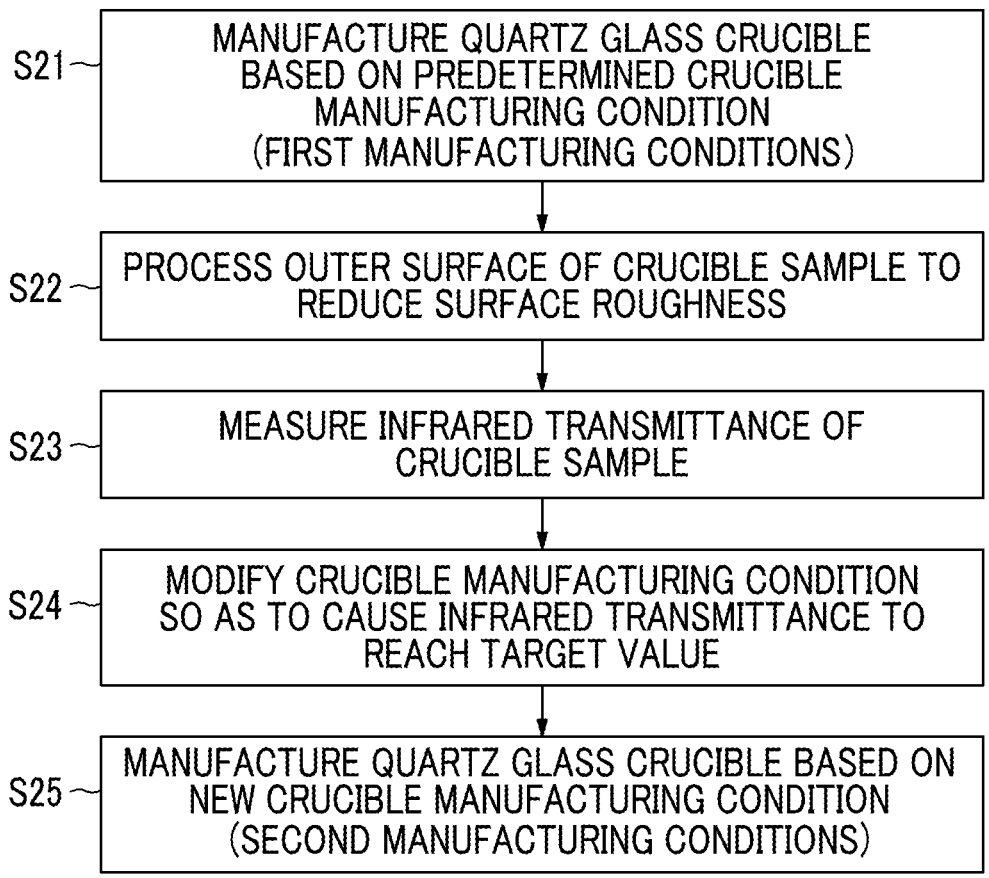
FIG. 8 is a flowchart showing a manufacturing method of a quartz glass crucible including an evaluation method of the infrared transmissivity described above.

FIG. 8 is a flowchart showing a manufacturing method of the quartz glass crucible 1 including the evaluation method of the infrared transmissivity described above.

The manufacturing method of the quartz glass crucible 1 according to the present embodiment includes a step (step S21) of manufacturing a quartz glass crucible (first quartz glass crucible) based on predetermined crucible manufacturing conditions (first manufacturing conditions), a step (step S22) of removing the semi-molten layer 13 of the quartz glass crucible, a step (step S23) of measuring infrared transmissivity of the portion of the quartz glass crucible from which the semi-molten layer has been removed, a step (step S24) of modifying the predetermined crucible manufacturing conditions so as to cause a measured value of infrared transmissivity to reach a target value, and a step (step S25) of manufacturing a subsequent quartz glass crucible (second quartz glass crucible) based on new crucible manufacturing conditions (second manufacturing conditions). It should be noted that in the step of removing the semi-molten layer 13, it is not necessary to completely remove the semi-molten layer 13, and it is sufficient to process the outer surface so that the surface roughness becomes low. As described above, by feeding back the evaluation result of infrared transmissivity of the crucible to the crucible manufacturing conditions, it is possible to efficiently manufacture a quartz glass crucible having a desired infrared transmissivity for each part.

Figure 9:
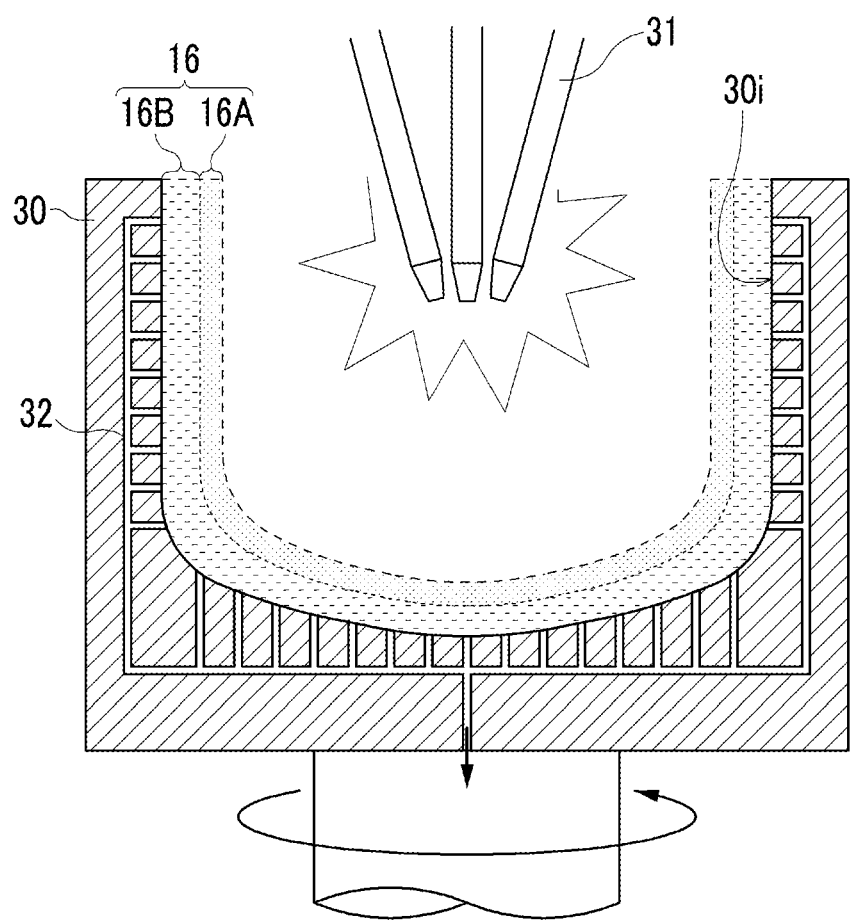
FIG. 9 is a schematic view for describing the manufacturing method of a quartz glass crucible according to a rotational molding method.
Figure 10:
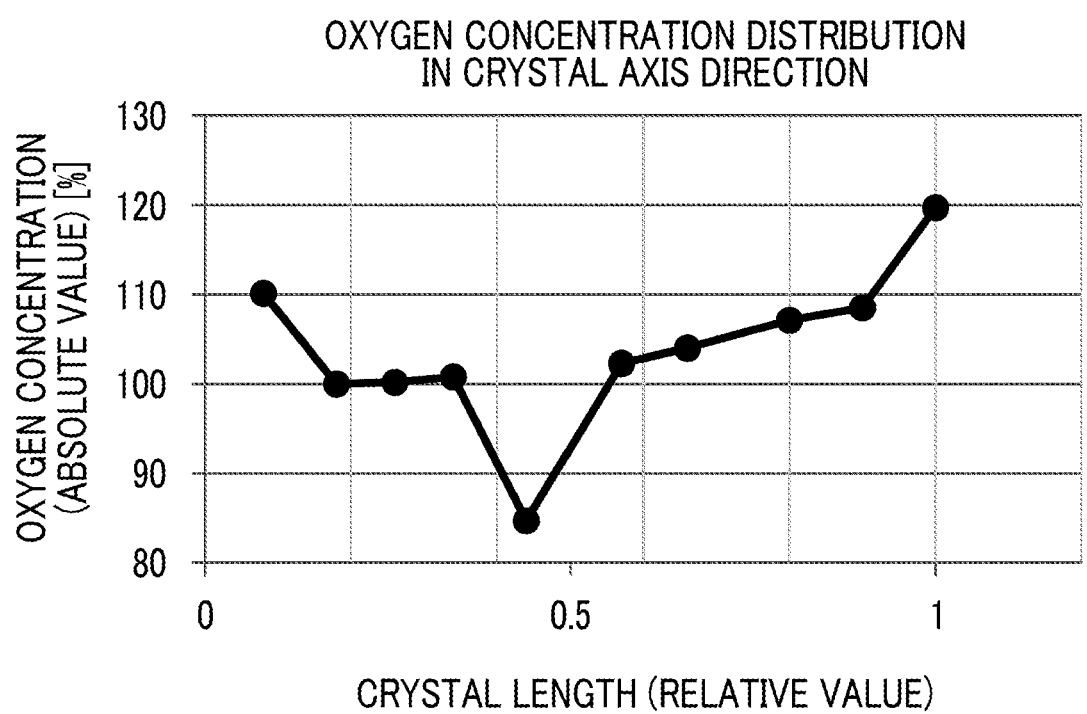
FIG. 10 is a graph showing the oxygen concentration distribution in the longitudinal direction of a silicon single crystal pulled up using a conventional quartz glass crucible.

FIG. 9 is a schematic view for describing the manufacturing method of the quartz glass crucible 1 according to the rotational molding method.

As illustrated in FIG. 9, the quartz glass crucible 1 according to the present embodiment can be manufactured by the so-called rotational molding method. In the rotational molding method, natural silica powder 16B and synthetic silica powder 16A are sequentially deposited on an inner surface 30i of a rotating mold 30 to form a deposition layer 16 of the raw material silica powder. It is also possible to use only natural silica powder as the raw material of the crucible. This raw material silica powder remains in a certain position while being adhered to the inner surface 30i of the mold 30 by centrifugal force, and is maintained in the shape of the crucible. By changing the thickness of the deposition layer of the raw material silica powder, the crucible thickness can be adjusted for each part.

Next, an arc electrode 31 is installed in the mold 30, and the deposition layer 16 of the raw material silica powder is arc-melted from the inner surface 30i side of the mold 30. Specific conditions such as heating time and heating temperature need to be appropriately determined in consideration of conditions such as the raw materials and size of the crucible. In this case, the amount of bubbles in the melted quartz glass is controlled by suctioning the deposition layer 16 of the raw material silica powder from a large number of vent holes 32 provided on the inner surface 30i of the mold 30. Specifically, at the start of arc melting, the suction force from the large number of vent holes 32 provided on the inner surface 30i of the mold 30 is strengthened to form the transparent layer 11, and after the formation of the transparent layer 11, the suction force is weakened to form the bubble layer 12.

Since the arc heat is gradually transferred from the inner side to the outer side of the deposition layer 16 of the raw material silica powder to melt the raw material silica powder, by changing decompression conditions at the timing at which the raw material silica powder starts to melt, the transparent layer 11 and the bubble layer 12 can be separately formed. When decompression melting is performed to strengthen decompression at the timing at which the silica powder melts, the arc atmosphere gas is not confined in the glass, and quartz glass containing no bubbles is formed. In addition, when normal melting (atmospheric pressure melting) in which decompression is weakened at the timing at which the raw material silica powder melts, the arc atmosphere gas is confined in the glass, and quartz glass containing a large number of bubbles is formed. The thicknesses of the transparent layer 11 and the bubble layer 12 can be adjusted for each part by, for example, changing the disposition and current of the arc electrode 31 to partially change the extent of melting during decompression melting or normal melting.

Thereafter, the arc heating is stopped, and the crucible is cooled. Accordingly, the quartz glass crucible 1 in which the transparent layer 11 and the bubble layer 12 are sequentially provided from the inside toward the outside of the crucible wall is completed.

As described above, in the quartz glass crucible 1 according to the present embodiment, the infrared transmissivity of the corner portion 10c is 25 to 51%, which is a lower infrared transmissivity than that of the corner portion of a crucible in the related art. Therefore, an excessive temperature rise in the inner surface of the corner portion 10c can be suppressed, and the amount of oxygen supplied from the crucible to the silicon melt can be suppressed, so that a silicon single crystal having a low oxygen concentration can be manufactured. In addition, the absolute value of the rate of change in infrared transmissivity is 3%/cm or less, the absolute value of the rate of change in thickness of the bubble layer from the side wall portion 10a to the corner portion 10c is 2.5 mm/cm or less, and the changes in the infrared transmissivity and the thickness from the side wall portion 10a to the corner portion 10c are gentle. Therefore, the variation in the temperature distribution on the inner surface of the crucible that is in contact with the silicon melt can be reduced, and a sudden change in the amount of oxygen supplied to the silicon melt due to a sudden change in convection in the silicon melt can be suppressed. Therefore, it is possible to suppress a sudden change in the oxygen concentration distribution in the longitudinal direction of the silicon single crystal at a specific part, and it is possible to pull up a silicon single crystal having a stable oxygen concentration distribution in the pulling-up axis direction.

While the preferred embodiments of the present invention have been described above, the present invention is not limited to the embodiments and may be variously modified without departing from the scope of the present invention. Accordingly, all such modifications are naturally included in the scope of the present invention.

Examples

<Discussion on Infrared Transmissivity Distribution of Crucible>

The effect of the infrared transmissivity distribution of the crucible on the oxygen concentration distribution of the silicon single crystal was discussed. In this discussion, samples A1 to A5 and B1 to B4 of quartz glass crucibles having an aperture of 32 inches (about 800 mm) were prepared, and the infrared transmissivity distribution in the height direction along the inner wall surface of each crucible sample was measured. In the measurement of the infrared transmissivity distribution, a measurement line was set from the center of the bottom portion of the crucible toward the upper end of the side wall portion, and the infrared transmissivity was obtained at intervals of 20 mm from the center of the bottom portion along the measurement line. A measuring device consisting of a combination of an infrared lamp and a laser power meter was used to measure the infrared transmissivity. As the infrared lamp, a near-infrared lamp having a peak near a wavelength of 1000 nm was used. As the laser power meter, one having a measurement range of 1 to 250 W, a wavelength range of 190 nm to 11 µm, and a calibration wavelength of 10.6 µm was used. It should be noted that the infrared transmissivity was measured in a direction perpendicular to the inner wall surface of the crucible. Thereafter, the rate of change in infrared transmissivity between two adjacent measurement points was obtained from the measured values of the infrared transmissivity.

Next, after pulling up a silicon single crystal using each crucible sample, the oxygen concentration in the silicon single crystal was measured by FTIR according to the standard of Old-ASTM_F121 (1979). Then, the presence or absence of sudden changes in the average oxygen concentration and the oxygen concentration distribution in the crystal longitudinal direction of the silicon single crystal was evaluated. Table 1 shows the results.

TABLE 1

| Crucible sample | Infrared transmissivity of corner portion of crucible (%) | Infrared transmissivity ratio (corner portion/side wall portion) | Maximum value of absolute value of rate of change in infrared transmissivity (%/cm) | Relative average oxygen concentration in axis direction | Sudden change in oxygen concentration distribution |
|---|---|---|---|---|---|
| Example 1 (A1) | 24 | 0.3 | 2.8 | Within 90 to 110% | Low |
| Example 2 (A2) | 57 | 0.8 | 2.8 | Within 90 to 110% | Low |
| Example 3 (A3) | 60 | 0.99 | 3.0 | Within 90 to 110% | Low |
| Example 4 (A4) | 25 | 0.8 | 2.8 | Within 95 to 105% | Low |
| Example 5 (A5) | 51 | 0.8 | 2.8 | Within 95 to 105% | Low |
| Comparative Example 1 (B1) | 30 | 1.1 | 2.8 | Outside range | Low |
| Comparative Example 2 (B2) | 10 | 0.2 | 2.8 | Outside range | Low |
| Comparative Example 3 (B3) | 43 | 1.2 | 3.5 | Outside range | High |
| Comparative Example 4 (B4) | 59 | 0.9 | 3.3 | Within 90 to 110% | High |

The infrared transmissivity of the corner portion of the crucible sample A1 according to Example 1 was 24%, and the ratio of the infrared transmissivity of the corner portion to that of the side wall portion was 0.3. In addition, the maximum value of the absolute value of the rate of change in infrared transmissivity of this crucible sample A1 was 2.8%/cm (3%/cm or less), so that a change in the infrared transmissivity was gentle. Furthermore, the average oxygen concentration in the longitudinal direction of a silicon single crystal pulled up using this crucible sample A1 was within a target oxygen concentration ±10% (within 90% to 110%), and a single crystal having a low oxygen concentration was obtained. There was no sudden change in oxygen concentration in the crystal longitudinal direction.

The infrared transmissivity of the corner portion of the crucible sample A2 according to Example 2 was 57%, and the ratio of the infrared transmissivity of the corner portion to that of the side wall portion was 0.8. In addition, the maximum value of the absolute value of the rate of change in infrared transmissivity of this crucible sample A2 was 2.8%/cm (3%/cm or less), so that a change in the infrared transmissivity was gentle. Furthermore, the average oxygen concentration in the longitudinal direction of a silicon single crystal pulled up using this crucible sample A2 was within the target oxygen concentration ±10% (within 90% to 110%), and a single crystal having a low oxygen concentration was obtained. There was no sudden change in oxygen concentration in the crystal longitudinal direction.

The infrared transmissivity of the corner portion of the crucible sample A3 according to Example 3 was 60%, and the ratio of the infrared transmissivity of the corner portion to that of the side wall portion was 0.99. In addition, the maximum value of the absolute value of the rate of change in infrared transmissivity of this crucible sample A3 was 3.0%/cm (3%/cm or less), so that a change in the infrared transmissivity was gentle. Furthermore, the average oxygen concentration in the longitudinal direction of a silicon single crystal pulled up using this crucible sample A3 was within the target oxygen concentration ±10% (within 90% to 110%), and a single crystal having a low oxygen concentration was obtained. There was no sudden change in oxygen concentration in the crystal longitudinal direction.

The infrared transmissivity of the corner portion of the crucible sample A4 according to Example 4 was 25%, and the ratio of the infrared transmissivity of the corner portion to that of the side wall portion was 0.8. In addition, the maximum value of the absolute value of the rate of change in infrared transmissivity of this crucible sample A4 was 2.8%/cm (3%/cm or less), so that a change in the infrared transmissivity was gentle. Furthermore, the average oxygen concentration in the longitudinal direction of a silicon single crystal pulled up using this crucible sample A4 was within the target oxygen concentration ±5% (within 95 to 105%), and a single crystal having a low oxygen concentration was obtained. There was no sudden change in oxygen concentration in the crystal longitudinal direction.

The infrared transmissivity of the corner portion of the crucible sample A5 according to Example 5 was 51%, and the ratio of the infrared transmissivity of the corner portion to that of the side wall portion was 0.8. In addition, the maximum value of the absolute value of the rate of change in infrared transmissivity of this crucible sample A5 was 2.8%/cm (3%/cm or less), so that a change in the infrared transmissivity was gentle. Furthermore, the average oxygen concentration in the longitudinal direction of a silicon single crystal pulled up using this crucible sample A5 was within the target oxygen concentration ±5% (within 95 to 105%) of, and a single crystal having a low oxygen concentration was obtained. There was no sudden change in oxygen concentration in the crystal longitudinal direction.

The infrared transmissivity of the corner portion of the crucible sample B1 according to Comparative Example 1 was 30%, and the ratio of the infrared transmissivity of the corner portion to that of the side wall portion was 1.1. In addition, the maximum value of the absolute value of the rate of change in infrared transmissivity of this crucible sample B1 was 2.8%/cm (3%/cm or less), so that a change in the infrared transmissivity was gentle. Furthermore, the average oxygen concentration in the longitudinal direction of a silicon single crystal pulled up using this crucible sample B1 became higher than the target oxygen concentration ±10%. That is, the average oxygen concentration was more than 110% of the target oxygen concentration, and a single crystal having a low oxygen concentration could not be obtained. There was no sudden change in oxygen concentration in the crystal longitudinal direction.

The infrared transmissivity of the corner portion of the crucible sample B2 according to Comparative Example 2 was 10%, and the ratio of the infrared transmissivity of the corner portion to that of the side wall portion was 0.2. In addition, the maximum value of the absolute value of the rate of change in infrared transmissivity of this crucible sample B2 was 2.8%/cm (3%/cm or less), so that a change in the infrared transmissivity was gentle. Furthermore, the average oxygen concentration in the longitudinal direction of a silicon single crystal pulled up using this crucible sample B2 became lower than the target oxygen concentration ±10%. Although there was no sudden change in the oxygen concentration in the crystal longitudinal direction, since the average oxygen concentration was less than 90% of the target oxygen concentration, it became difficult to adjust the oxygen concentration due to the instability of convection of the melt, so that the variation in oxygen concentration in the crystal axis direction was large.

The infrared transmissivity of the corner portion of the crucible sample B3 according to Comparative Example 3 was 43%, and the ratio of the infrared transmissivity of the corner portion to that of the side wall portion was 1.2. In addition, the maximum value of the absolute value of the rate of change in infrared transmissivity of this crucible sample B3 was 3.5%/cm, which was a high rate of change exceeding 3%/cm. Furthermore, the average oxygen concentration in the longitudinal direction of a silicon single crystal pulled up using this crucible sample B3 became higher than the target oxygen concentration ±10%, so that a single crystal having a low oxygen concentration could not be obtained. Furthermore, a sudden change in oxygen concentration in the crystal longitudinal direction was also observed.

The infrared transmissivity of the corner portion of the crucible sample B4 according to Comparative Example 4 was 59%, and the ratio of the infrared transmissivity of the corner portion to that of the side wall portion was 0.9. In addition, the maximum value of the absolute value of the rate of change in infrared transmissivity of this crucible sample B4 was 3.3%/cm, which was a high rate of change exceeding 3%/cm. The average oxygen concentration in the longitudinal direction of a silicon single crystal pulled up using this crucible sample B4 was within the target oxygen concentration ±10% (within 90 to 110%), so that a single crystal having a low oxygen concentration was obtained. However, a sudden change in oxygen concentration in the crystal longitudinal direction was observed. From the result, it can be seen that a sudden change in the infrared transmissivity distribution of the crucible causes a sudden change in the oxygen concentration in the crystal longitudinal direction.

<Discussion on Thickness Distribution of Bubble Layer of Crucible>

Next, the effect of the thickness distribution of the bubble layer of the crucible on the oxygen concentration distribution of the silicon single crystal was discussed. In this discussion, samples A6 to A11 and B5 to B8 of quartz glass crucibles having an aperture of 32 inches (about 800 mm) were prepared, and the thickness in the height direction along the inner wall surface of each crucible sample and the thickness distribution of the bubble layer were measured together with the infrared transmissivity distribution. As in the measurement of the infrared transmissivity, in the measurement of the thickness of the crucible and the thickness distribution of the bubble layer, a measurement line was set from the center of the bottom portion of the crucible toward the upper end of the side wall portion, and the thickness of the crucible and the thickness of the bubble layer were obtained at intervals of 20 mm from the center of the bottom portion along the measurement line. An ultrasonic measuring machine (ultrasonic thickness gauge) was used to measure the thickness of the crucible and the thickness of the bubble layer. It should be noted that the thickness of the crucible and the thickness of the bubble layer were measured in a direction perpendicular to the inner wall surface of the crucible. Thereafter, the rate of change in thickness of the bubble layer between two adjacent measurement points was obtained from the measured values of the thickness of the bubble layer.

Next, after pulling up a silicon single crystal using each crucible sample, the oxygen concentration in the silicon single crystal was measured by FTIR according to the standard of Old-ASTM_F121 (1979). Then, the presence or absence of sudden changes in the average oxygen concentration and the oxygen concentration distribution in the crystal longitudinal direction of the silicon single crystal was evaluated. Table 2 shows the results.

TABLE 2

| Crucible sample | Thickness of corner portion of crucible (mm) | Thickness of bubble layer of corner portion of crucible (mm) | Infrared transmissivity ratio (corner portion/side wall portion) | Maximum value of absolute value of rate of change in thickness of bubble layer (mm/cm) | Relative average oxygen concentration in axis direction | Sudden change in oxygen concentration distribution |
|---|---|---|---|---|---|---|
| Example 6 (A6) | 18 | 17 | 0.3 | 1.5 | Within 90 to 110% | Low |
| Example 7 (A7) | 18 | 17 | 0.8 | 2.4 | Within 90 to 110% | Low |
| Example 8 (A8) | 31 | 30 | 0.99 | 2.5 | Within 90 to 110% | Low |
| Example 9 (A9) | 19 | 18 | 0.5 | 2.4 | Within 95 to 105% | Low |
| Example 10 (A10) | 25 | 23 | 0.5 | 2.4 | Within 95 to 105% | Low |
| Example 11 (A11) | 30 | 29 | 0.4 | 2.4 | Within 95 to 105% | Low |
| Comparative Example 5 (B5) | 28 | 26 | 1.1 | 2.3 | Outside range | Low |
| Comparative Example 6 (B6) | 20 | 17 | 0.2 | 2.5 | Outside range | Low |
| Comparative Example 7 (B7) | 18 | 17 | 1.0 | 2.6 | Outside range | High |
| Comparative Example 8 (B8) | 25 | 17 | 0.8 | 3.0 | Within 90 to 110% | High |

The thickness of the corner portion of the crucible sample A6 according to Example 6 was 18 mm, and the thickness of the bubble layer at the corner portion was 17 mm. It should be noted that the thickness of the bubble layer is a value measured at the maximum thickness position of the corner portion. In addition, the ratio of the infrared transmissivity of the corner portion to that of the side wall portion was 0.3. Furthermore, the maximum value of the absolute value of the rate of change in thickness of the bubble layer of this crucible sample A6 was 1.5 mm/cm (2.5 mm/cm or less), so that a change in the thickness of the bubble layer was gentle. Moreover, the average oxygen concentration in the longitudinal direction of a silicon single crystal pulled up using this crucible sample A6 was within the target oxygen concentration ±10% (within 90 to 110%), and a single crystal having a low oxygen concentration was obtained. There was no sudden change in oxygen concentration in the crystal longitudinal direction.

The thickness of the corner portion of the crucible sample A7 according to Example 7 was 18 mm, and the thickness of the bubble layer at the corner portion was 17 mm. In addition, the ratio of the infrared transmissivity of the corner portion to that of the side wall portion was 0.8. Furthermore, the maximum value of the absolute value of the rate of change in thickness of the bubble layer of this crucible sample A7 was 2.4 mm/cm (2.5 mm/cm or less), so that a change in the thickness of the bubble layer was gentle. Moreover, the average oxygen concentration in the longitudinal direction of a silicon single crystal pulled up using this crucible sample A7 was within the target oxygen concentration ±10% (within 90 to 110%), and a single crystal having a low oxygen concentration was obtained. There was no sudden change in oxygen concentration in the crystal longitudinal direction.

The thickness of the corner portion of the crucible sample A8 according to Example 8 was 31 mm, and the thickness of the bubble layer at the corner portion was 30 mm. In addition, the ratio of the infrared transmissivity of the corner portion to that of the side wall portion was 0.99. Furthermore, the maximum value of the absolute value of the rate of change in thickness of the bubble layer of this crucible sample A8 was 2.5 mm/cm (2.5 mm/cm or less), so that a change in the thickness of the bubble layer was gentle. Moreover, the average oxygen concentration in the longitudinal direction of a silicon single crystal pulled up using this crucible sample A8 was within the target oxygen concentration ±10% (within 90 to 110%), and a single crystal having a low oxygen concentration was obtained. There was no sudden change in oxygen concentration in the crystal longitudinal direction.

The thickness of the corner portion of the crucible sample A9 according to Example 9 was 19 mm, and the thickness of the bubble layer at the corner portion was 18 mm. In addition, the ratio of the infrared transmissivity of the corner portion to that of the side wall portion was 0.5. Furthermore, the maximum value of the absolute value of the rate of change in thickness of the bubble layer of this crucible sample A9 was 2.4 mm/cm (2.5 mm/cm or less), so that a change in the thickness of the bubble layer was gentle. Moreover, the average oxygen concentration in the longitudinal direction of a silicon single crystal pulled up using this crucible sample A9 was within the target oxygen concentration ±5% (within 95 to 105%), and a single crystal having a low oxygen concentration was obtained. There was no sudden change in oxygen concentration in the crystal longitudinal direction.

The thickness of the corner portion of the crucible sample A10 according to Example 10 was 25 mm, and the thickness of the bubble layer at the corner portion was 23 mm. In addition, the ratio of the infrared transmissivity of the corner portion to that of the side wall portion was 0.5. Furthermore, the maximum value of the absolute value of the rate of change in thickness of the bubble layer of this crucible sample A10 was 2.4 mm/cm (2.5 mm/cm or less), so that a change in the thickness of the bubble layer was gentle. Moreover, the average oxygen concentration in the longitudinal direction of a silicon single crystal pulled up using this crucible sample A10 was within the target oxygen concentration ±5% (within 95 to 105%), and a single crystal having a low oxygen concentration was obtained. There was no sudden change in oxygen concentration in the crystal longitudinal direction.

The thickness of the corner portion of the crucible sample A11 according to Example 11 was 30 mm, and the thickness of the bubble layer at the corner portion was 29 mm. In addition, the ratio of the infrared transmissivity of the corner portion to that of the side wall portion was 0.4. Furthermore, the maximum value of the absolute value of the rate of change in thickness of the bubble layer of this crucible sample A11 was 2.4 mm/cm (2.5 mm/cm or less), so that a change in the thickness of the bubble layer was gentle. Moreover, the average oxygen concentration in the longitudinal direction of a silicon single crystal pulled up using this crucible sample A11 was within the target oxygen concentration ±5% (within 95 to 105%), and a single crystal having a low oxygen concentration was obtained. There was no sudden change in oxygen concentration in the crystal longitudinal direction.

The thickness of the corner portion of the crucible sample B5 according to Comparative Example 5 was 28 mm, and the thickness of the bubble layer at the corner portion was 26 mm. In addition, the ratio of the infrared transmissivity of the corner portion to that of the side wall portion was 1.1. Furthermore, the maximum value of the absolute value of the rate of change in thickness of the bubble layer of this crucible sample B5 was 2.3 mm/cm (2.5 mm/cm or less), so that a change in the thickness of the bubble layer was gentle. However, the average oxygen concentration in the longitudinal direction of a silicon single crystal pulled up using this crucible sample B5 was higher than the target oxygen concentration ±10%. That is, the average oxygen concentration was more than 110% of the target oxygen concentration, and a single crystal having a low oxygen concentration could not be obtained. There was no sudden change in oxygen concentration in the crystal longitudinal direction.

The thickness of the corner portion of the crucible sample B6 according to Comparative Example 6 was 20 mm, and the thickness of the bubble layer at the corner portion was 17 mm. In addition, the ratio of the infrared transmissivity of the corner portion to that of the side wall portion was 0.2. Furthermore, the maximum value of the absolute value of the rate of change in thickness of the bubble layer of this crucible sample B6 was 2.5 mm/cm (2.5 mm/cm or less), so that a change in the thickness of the bubble layer was gentle. However, the average oxygen concentration in the longitudinal direction of a silicon single crystal pulled up using this crucible sample B6 was lower than the target oxygen concentration ±10%. Although there was no sudden change in the oxygen concentration in the crystal longitudinal direction, since the average oxygen concentration was less than 90% of the target oxygen concentration, it became difficult to adjust the oxygen concentration due to the instability of convection of the melt, so that the variation in oxygen concentration in the crystal axis direction was large.

The thickness of the corner portion of the crucible sample B7 according to Comparative Example 7 was 18 mm, and the thickness of the bubble layer at the corner portion was 17 mm. In addition, the ratio of the infrared transmissivity of the corner portion to that of the side wall portion was 1.0. Furthermore, the maximum value of the absolute value of the rate of change in thickness of the bubble layer of this crucible sample B7 was 2.6 mm/cm, which was a high rate of change exceeding 2.5 mm/cm. The average oxygen concentration in the longitudinal direction of a silicon single crystal pulled up using this crucible sample B7 became higher than the target oxygen concentration ±10%, so that a single crystal having a low oxygen concentration could not be obtained. Furthermore, a sudden change in oxygen concentration in the crystal longitudinal direction was also observed.

The thickness of the corner portion of the crucible sample B8 according to Comparative Example 8 was 25 mm, and the thickness of the bubble layer at the corner portion was 17 mm. In addition, the ratio of the infrared transmissivity of the corner portion to that of the side wall portion was 0.8. Furthermore, the maximum value of the absolute value of the rate of change in thickness of the bubble layer of this crucible sample B8 was 3.0 mm/cm, which was a high rate of change exceeding 2.5 mm/cm. The average oxygen concentration in the longitudinal direction of a silicon single crystal pulled up using this crucible sample B8 was within the target oxygen concentration ±10% (within 90 to 110%), so that a single crystal having a low oxygen concentration was obtained. However, a sudden change in oxygen concentration in the crystal longitudinal direction was observed.

REFERENCE SIGNS LIST

1 Quartz glass crucible
5 Silicon melt
5a Melt surface of silicon melt
6 Silicon single crystal
10a Side wall portion
10b Bottom portion
10c Corner portion
10i Inner surface of crucible
10o Outer surface of crucible
11 Transparent layer
12 Bubble layer
16 Deposition layer of raw material silica powder
16A Synthetic silica powder
16B Natural silica powder
20 Heater
21 Infrared lamp
22 Laser power meter
25 Carbon susceptor
30 Mold
30i Inner surface of mold
31 Arc electrode
32 Vent hole

The invention claimed is:

1. A pre-use quartz glass crucible comprising:
a cylindrical side wall portion;
a bottom portion;
a corner portion connecting the side wall portion and the bottom portion to each other;
a transparent layer made of quartz glass that does not contain bubbles;
a bubble layer formed outside the transparent layer and made of quartz glass containing bubbles at a bubble content of more than 0.1 vol %; and
a semi-molten layer formed outside the bubble layer and having a rugged surface, which is a layer solidified by cooling raw material silica powder in a partially melted state,
wherein a ratio of an infrared transmissivity of the corner portion at a maximum thickness position of the corner portion to an infrared transmissivity of the side wall portion is 0.3 or more and 0.99 or less, and
an absolute value of a rate of change in infrared transmissivity in a height direction along a wall surface of the crucible from a center of the bottom portion toward a rim of the crucible is 3%/cm or less,
wherein the infrared transmissivity of the crucible is a value measured when removing the semi-molten layer from the crucible for measurement purposes.

2. The quartz glass crucible according to claim 1,
wherein the infrared transmissivity of the corner portion at the maximum thickness position of the corner portion is 25% or more and 51% or less, which represents what percentage of infrared light irradiated onto the crucible is transmitted therethrough.

3. The quartz glass crucible according to claim 2,
wherein an absolute value of a rate of change in thickness of the bubble layer in the height direction along the wall surface of the crucible from the center of the bottom portion toward the rim of the crucible is 2.5 mm/cm or less.

4. The quartz glass crucible according to claim 2,
wherein an aperture of the crucible is 32 inches,
a maximum thickness of the corner portion is 19 mm or more and 30 mm or less, and
a thickness of the bubble layer at the maximum thickness position of the corner portion is 18 mm or more and 29 mm or less.

5. The quartz glass crucible according to claim 2,
wherein a bubble content of the bubble layer at the maximum thickness position of the corner portion is more than 0.1 vol % and 5 vol % or less.

6. The quartz glass crucible according to claim 1,
wherein an absolute value of a rate of change in thickness of the bubble layer in the height direction along the wall surface of the crucible from the center of the bottom portion toward the upper end of the side wall portion is 2.5 mm/cm or less.

7. The quartz glass crucible according to claim 6,
wherein an aperture of the crucible is 32 inches,
a maximum thickness of the corner portion is 19 mm or more and 30 mm or less, and
a thickness of the bubble layer at the maximum thickness position of the corner portion is 18 mm or more and 29 mm or less.

8. The quartz glass crucible according to claim 6,
wherein a bubble content of the bubble layer at the maximum thickness position of the corner portion is more than 0.1 vol % and 5 vol % or less.

9. The quartz glass crucible according to claim 1,
wherein an aperture of the crucible is 32 inches,
a maximum thickness of the corner portion is 19 mm or more and 30 mm or less, and
a thickness of the bubble layer at the maximum thickness position of the corner portion is 18 mm or more and 29 mm or less.

10. The quartz glass crucible according to claim 1,
wherein a bubble content of the bubble layer at the maximum thickness position of the corner portion is more than 0.1 vol % and 5 vol % or less.

11. The quartz glass crucible according to claim 1,
wherein a thickness of the bubble layer at the cylindrical side wall portion is larger than that of the transparent layer at the cylindrical side wall portion, and
a thickness of the bubble layer at the corner portion is larger than a thickness of the transparent layer at the cylindrical side wall portion.

12. A pre-use quartz glass crucible comprising:
a cylindrical side wall portion;
a bottom portion;
a corner portion connecting the side wall portion and the bottom portion to each other;
a transparent layer made of quartz glass that does not contain bubbles;
a bubble layer made of quartz glass containing bubbles at a bubble content of more than 0.1 vol % and formed outside the transparent layer; and
a semi-molten layer formed outside the bubble layer and having a rugged surface, which is a layer solidified by cooling raw material silica powder in a partially melted state,
wherein a ratio of an infrared transmissivity of the corner portion at a maximum thickness position of the corner portion to an infrared transmissivity of the side wall portion is 0.3 or more and 0.99 or less, and
an absolute value of a rate of change in thickness of the bubble layer in a height direction along a wall surface of the crucible from a center of the bottom portion toward a rim of the crucible is 2.5 mm/cm or less,
wherein the infrared transmissivity of the crucible is a value measured when removing the semi-molten layer from the crucible for measurement purposes.

13. The quartz glass crucible according to claim 12,
wherein an aperture of the crucible is 32 inches,
a maximum thickness of the corner portion is 19 mm or more and 30 mm or less, and
a thickness of the bubble layer at the maximum thickness position of the corner portion is 18 mm or more and 29 mm or less.

14. The quartz glass crucible according to claim 12,
wherein a bubble content of the bubble layer at the maximum thickness position of the corner portion is more than 0.1 vol % and 5 vol % or less.

15. The quartz glass crucible according to claim 12,
wherein the infrared transmissivity of the corner portion at the maximum thickness position is 25% or more and 51% or less, which represents what percentage of infrared light irradiated onto the crucible is transmitted therethrough.

16. The quartz glass crucible according to claim 12,
wherein a thickness of the bubble layer at the cylindrical side wall portion is larger than that of the transparent layer at the cylindrical side wall portion, and
a thickness of the bubble layer at the corner portion is larger than a thickness of the transparent layer at the cylindrical side wall portion.

* * * * *